United States Patent
Tzou et al.

(10) Patent No.: US 6,900,118 B2
(45) Date of Patent: May 31, 2005

(54) METHOD FOR PREVENTING CONTACT DEFECTS IN INTERLAYER DIELECTRIC LAYER

(75) Inventors: Kaan-Lu Tzou, Taipei (TW); Yan-Hong Chen, Taipei (TW); Yi-Nan Chen, Taipei (TW); Chang-Rong Wu, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 4 days.

(21) Appl. No.: 10/727,966

(22) Filed: Dec. 4, 2003

(65) Prior Publication Data

US 2005/0048763 A1 Mar. 3, 2005

(30) Foreign Application Priority Data

Sep. 3, 2003 (TW) .......................................... 92124302 A

(51) Int. Cl.$^7$ .......................................... H01L 21/4763
(52) U.S. Cl. ........................ 438/624; 438/637; 438/723; 438/783
(58) Field of Search ................................. 438/622, 624, 438/637, 723, 778, 783

(56) References Cited

U.S. PATENT DOCUMENTS

| | | | |
|---|---|---|---|
| 5,989,983 A | * 11/1999 | Goo et al. ................... | 438/473 |
| 6,239,042 B1 | * 5/2001 | Sonego et al. ............... | 438/778 |
| 6,261,975 B1 | * 7/2001 | Xia et al. .................... | 438/783 |
| 6,319,848 B1 | * 11/2001 | Litwin et al. ................ | 438/761 |
| 6,723,597 B2 | * 4/2004 | Abbott et al. ................ | 438/238 |
| 6,822,333 B1 | * 11/2004 | Yu .............................. | 257/774 |
| 2004/0121590 A1 | * 6/2004 | Moon et al. ................. | 438/639 |

* cited by examiner

*Primary Examiner*—Tuan H. Nguyen
(74) *Attorney, Agent, or Firm*—Quintero Law Office

(57) ABSTRACT

A method of forming an interlayer dielectric (ILD) layer. A dielectric layer containing boron and phosphorous is formed overlying a substrate. A plasma treatment is subsequently performed on the dielectric layer using argon or nitrogen as a process gas. A capping layer is formed in-situ overlying the dielectric layer to serve as the ILD layer with the dielectric layer. A reflow process is subsequently performed on the ILD layer. A method for preventing formation of etching defects in a contact is also disclosed.

17 Claims, 4 Drawing Sheets

METHOD FOR PREVENTING CONTACT DEFECTS IN INTERLAYER DIELECTRIC LAYER

BACKGROUND OF THE INVENTION

1. Field of the Invention

The present invention relates in general to a semiconductor process, and more particularly, to a method of forming an interlayer dielectric (ILD) layer and a method for preventing formation of etching defects in a contact.

2. Description of the Related Art

As semiconductor device geometries continue to decrease in size to provide more devices per fabricated wafer and faster devices, misalignment between each patterned layer is a serious obstacle. Therefore, many self-aligned processes have been developed in order to prevent misalignment and decrease the interval between devices, thereby increasing the device density.

FIGS. 1a to 1c are cross-sections showing a conventional method of forming a substrate contact ($C_s$) for a memory device. First, in FIG. 1a, a silicon substrate 100, is provided. The substrate 100 may contain any semiconductor device, such as MOS transistors, and capacitors, used in the memory devices. Here, in order to simplify the diagram, only a flat substrate is depicted. Moreover, the substrate 100 has a peripheral circuit region 10.

Next, a plurality of transistors 106 composed of gate structures 104 and source/drain doping regions 102 is formed on the peripheral circuit region 10. The gate structure 104 is composed of a gate dielectric layer, a gate, a gate capping layer, and a gate spacer.

Thereafter, a borophosphsilicate glass (BPSG) layer 108 is formed on the substrate 100 and fills the gap between the gate structures 104 to serve as an interlayer dielectric (ILD) layer. Next, a reflow process is performed on the BPSG layer 108 to make its surface flatter. Next, a photoresist layer 109 is formed on the BPSG layer 108 and lithography is subsequently performed to form an opening 109a therein for defining the substrate contact.

Next, in FIG. 1b, the BPSG layer 108 under the opening 109a is etched using the photoresist layer 109 as a mask to form the substrate contact 110 on the peripheral circuit region 10 to expose the surface of the substrate 100. However, since the thermal stability of the BPSG layer 108 is poor and the BPSG layer 108 easily reacts with moisture, poor etching profiles and etching defects occur in the substrate contact 110 after subsequent lithography and etching, as indicated by the arrow "a" shown in the FIG. 1b.

Finally, In FIG. 1c, after the photoresist layer 109 is removed, a photoresist pattern layer (not shown) is formed on the BPSG layer 108 to define a trench opening therein. Next, a trench 111 is formed by etching in the BPSG layer 108 near the substrate contact 110. As the integration of integrated circuits increases, the trench 111 is very close to the substrate contact 110. Accordingly, poor etching profiles or defects in the substrate contact 110 result in bridging between a metal plug 112 filled in the substrate contact 110 and a metal layer 114 filled in the trench 111, as the arrow "b" shown in the diagram, the memory device failure.

SUMMARY OF THE INVENTION

Accordingly, an object of the present invention is to provide a method of forming an interlayer dielectric (ILD) layer, which employs a plasma treatment performed on a dielectric layer containing boron and phosphorous and a capping layer in-situ formed overlying the dielectric layer, thereby improving moisture absorption in the interlayer dielectric layer and increasing thermal stability of the dielectric layer containing boron and phosphorous.

Another object of the present invention is to provide a method for preventing formation of etching defects in a contact, which employs a plasma treatment performed on a dielectric layer containing boron and phosphorous and a capping layer in-situ formed overlying the dielectric layer before the dielectric layer is etched, thereby preventing etching defects formed in the contact to increase device yield.

According to the object of the invention, a method of forming an interlayer dielectric layer is provided. First, a dielectric layer containing boron and phosphorous is formed overlying a substrate. Next, a plasma treatment is performed on the dielectric layer. Next, a capping layer is formed in-situ overlying the dielectric layer to serve as the ILD layer with the dielectric layer. Finally, a reflow process is performed on the ILD layer.

The dielectric layer containing boron and phosphorous can be a borophosphosilicate glass (BPSG) layer with a thickness of about 4000 to 10000 Å. The capping layer can be an undoped silicate glass (USG) layer with a thickness of about 120 to 400 Å.

Moreover, the plasma treatment can be performed using argon or nitrogen as a process gas at a temperature of about 600 to 700° C. for 5 to 20 sec.

According to another object of the invention, a method for preventing formation of etching defects in a contact is provided. First, a BPSG layer is formed overlying a substrate. Next, a plasma treatment is performed on the BPSG layer. Next, a USG layer is formed in-situ overlying the BPSG layer to serve as an ILD layer with the BPSG layer. Next, a reflow process is performed on the ILD layer. The ILD layer is then etched to form at least one contact opening therein to expose the surface of the substrate. Finally, the contact opening is filled with a conductive plug.

The BPSG layer has a thickness of about 4000 to 10000 Å, and the USG layer has a thickness of about 120 to 400 Å.

Moreover, the plasma treatment can be performed using argon or nitrogen as a process gas at a temperature of 600 to 700° C. for 5 to 20 sec.

DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

FIGS. 2a to 2d are cross-sections showing a method of forming a substrate contact ($C_s$) for a memory device, such as a dynamic random access memory (DRAM), according to the invention.

Figure 1A:
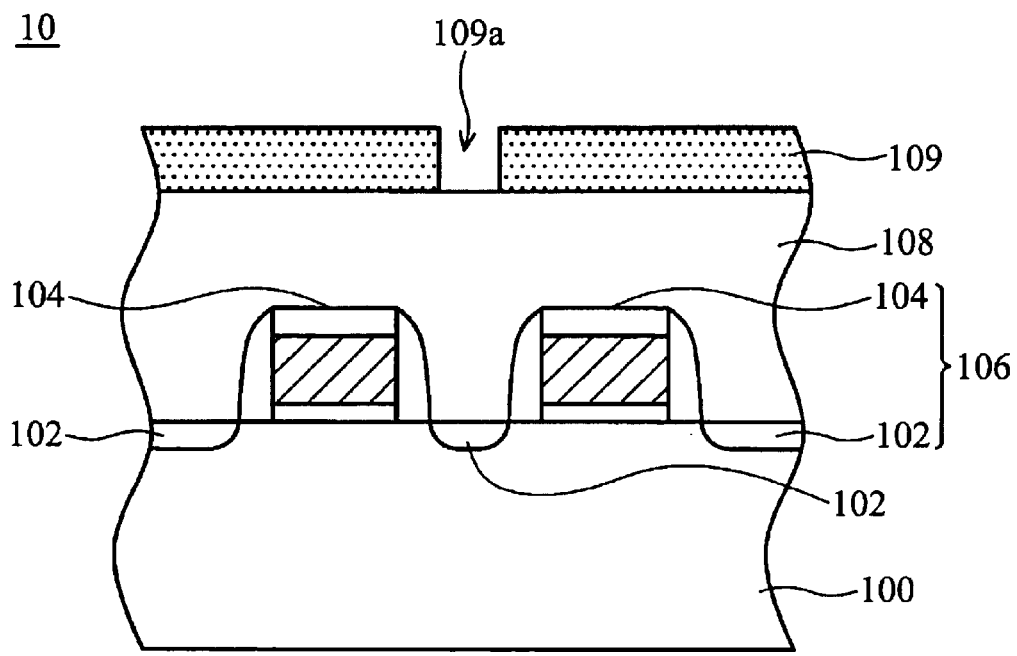
FIGS. 1a to 1c are cross-sections showing a conventional method of forming a substrate contact for a memory device.
Figure 1B:
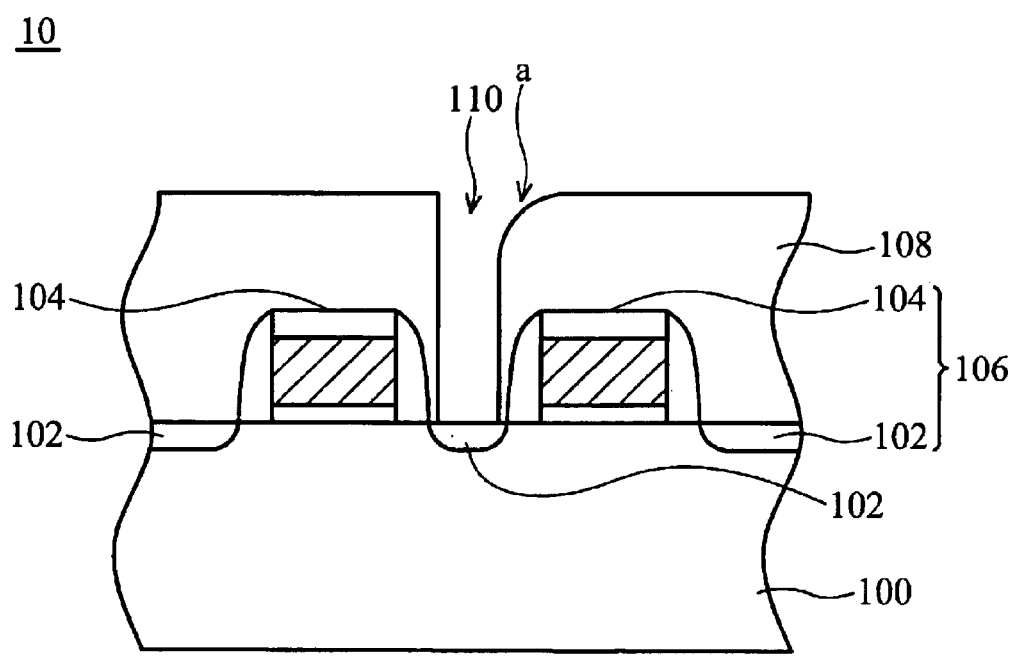
Figure 1C:
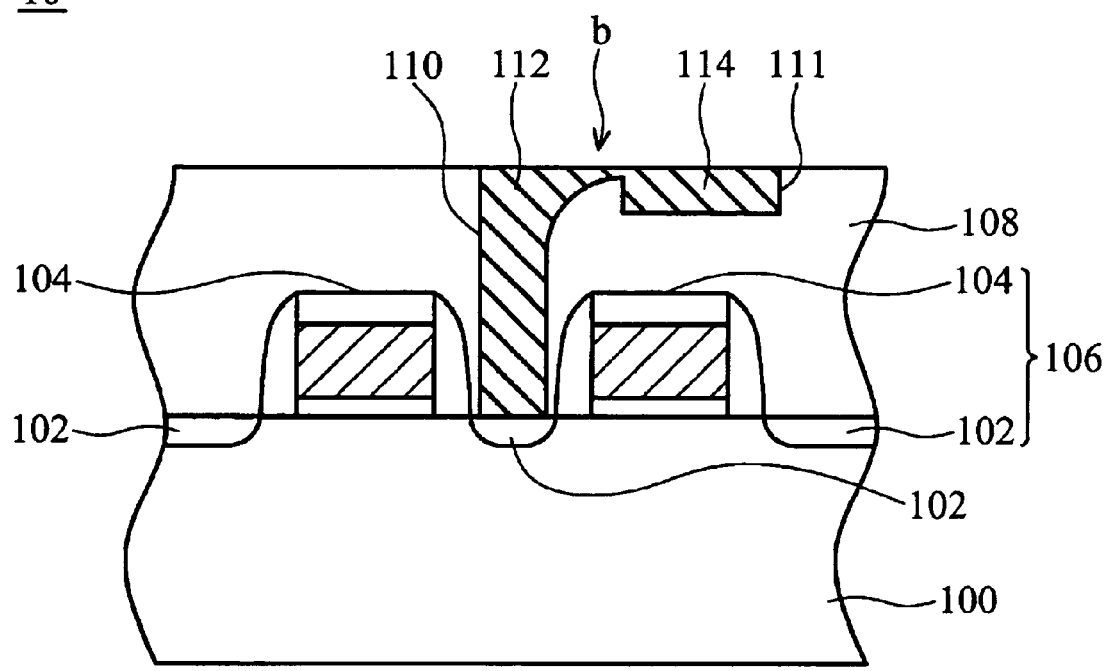
Figure 2A:
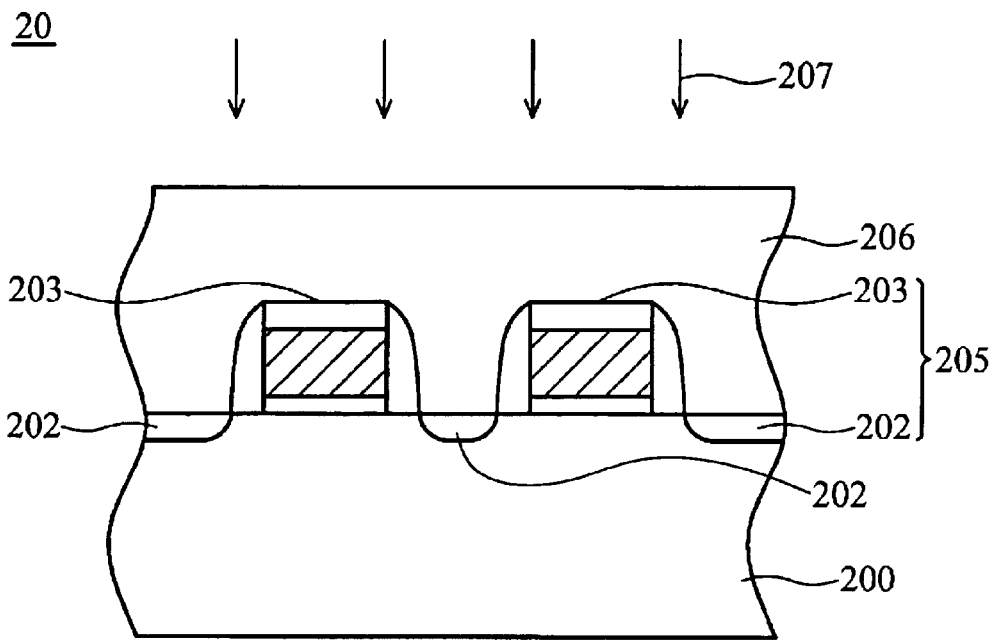
FIGS. 2a to 2d are cross-sections showing a method of forming a substrate contact for a memory device according to the invention.

First, in FIG. 2a, a substrate 200, such as a silicon substrate or other semiconductor substrate, is provided. The substrate 200 may contain any semiconductor devices, such as MOS transistors, and capacitors, used in the memory devices. Here, in order to simplify the diagram, only a flat substrate is depicted. Moreover, the substrate 200 has a peripheral circuit region 20.

Next, a plurality of transistors 205 composed of gate structures 203 and source/drain doping regions 202 is formed on the peripheral circuit region 20. The gate structure 203 is composed of a gate dielectric layer, a gate, a gate capping layer, and a gate spacer. The gate dielectric layer may be a silicon oxide layer formed by thermal oxidation. The gate may be a single polysilicon layer or a composite layer composed of a polysilicon layer and a metal silicide layer thereon. The gate capping layer and the gate spacer may be composed of silicon nitride. The source/drain doping region 202 can be formed by conventional ion implantation.

Thereafter, a dielectric layer containing boron and phosphorous 206 is formed overlying the substrate 200 and fills the gap between the transistors 205. In the invention, the dielectric layer containing boron and phosphorous 206 can be a borophosphosilicate glass (BPSG) layer and has a thickness of about 4000 to 10000 Å. Next, a critical step of the invention is performed. A surface treatment 207, such as a plasma treatment, is performed on the dielectric layer containing boron and phosphorous 206 to improve its thermal stability. In the invention, the plasma treatment 207 is performed using an inert gas, for example, argon or nitrogen, as a process gas. Moreover, the plasma treatment 207 is performed at 600 to 700° C. for 5 to 20 sec, and 10 sec is preferable.

Figure 2B:
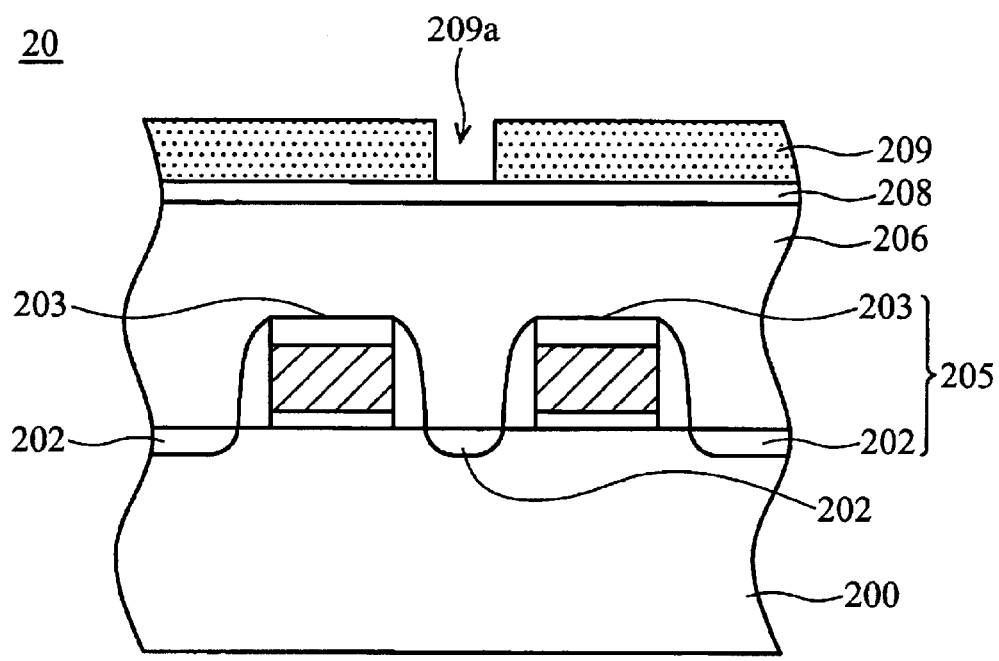

Next, in FIG. 2b, a capping layer 208 is formed in-situ overlying the dielectric layer containing boron and phosphorous 206, thereby preventing moisture absorption in the dielectric layer 206 in subsequent processes. In the invention, the capping layer 208 and the dielectric layer containing boron and phosphorous 206 serve as an interlayer dielectric (ILD) layer. Moreover, the capping layer 208 can be an undoped silicate glass (USG) layer. It is noted that the capping layer 208 must have a suitable thickness. If the capping layer 208 is too thick, it will effectively block moisture in the underlying dielectric layer 206, but the gap filling capability of the dielectric layer 206 suffers. Conversely, if the capping layer 208 is too thin, better gap filling capability of the dielectric layer 206 can be obtained, but the capping layer 208 cannot effectively block moisture in the underlying dielectric layer 206. As a result, etching defects are produced after subsequent lithography and etching. Accordingly, in the invention, the capping layer 208 has a thickness of about 120 to 400 Å.

Thereafter, a high temperature reflow process is performed on the ILD layer 206, 208, to make its surface flatter. In the invention, the reflow process is performed at a temperature of about 780 to 830° C.

Next, a photoresist layer 209 is coated on the capping layer 208 and lithography is then performed on the photoresist layer 209 to form an opening 209a therein for defining the substrate contact.

Figure 2C:
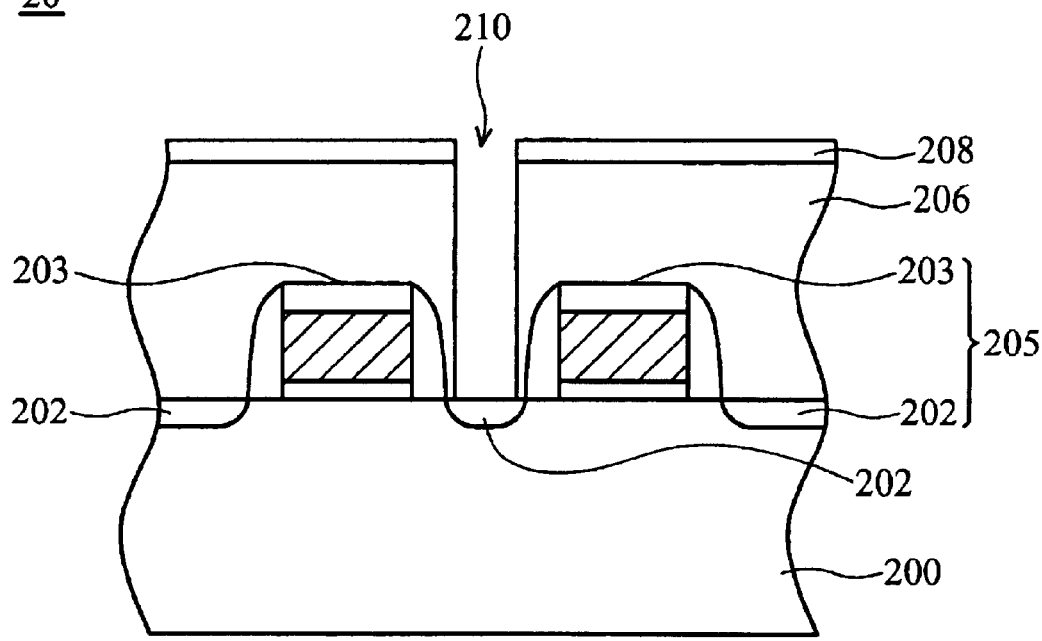

Next, in FIG. 2c, the ILD layer 206, 208 under the opening 209a is etched using the photoresist layer 209 as a mask to form at least one contact opening 210 in the ILD layer 206, 208 on the peripheral circuit region 20 to expose the surface of the substrate 200. The contact opening 210 is used as the substrate contact. Since the surface treatment is performed on the dielectric layer containing boron and phosphorous 206, the thermal stability of the dielectric layer 206 can be increased. Moreover, the capping layer 208 is formed on the dielectric layer 206, to prevent moisture in the dielectric layer 206. Accordingly, poor etching profiles or etching defects can be eliminated in subsequent lithography and etching.

Figure 2D:
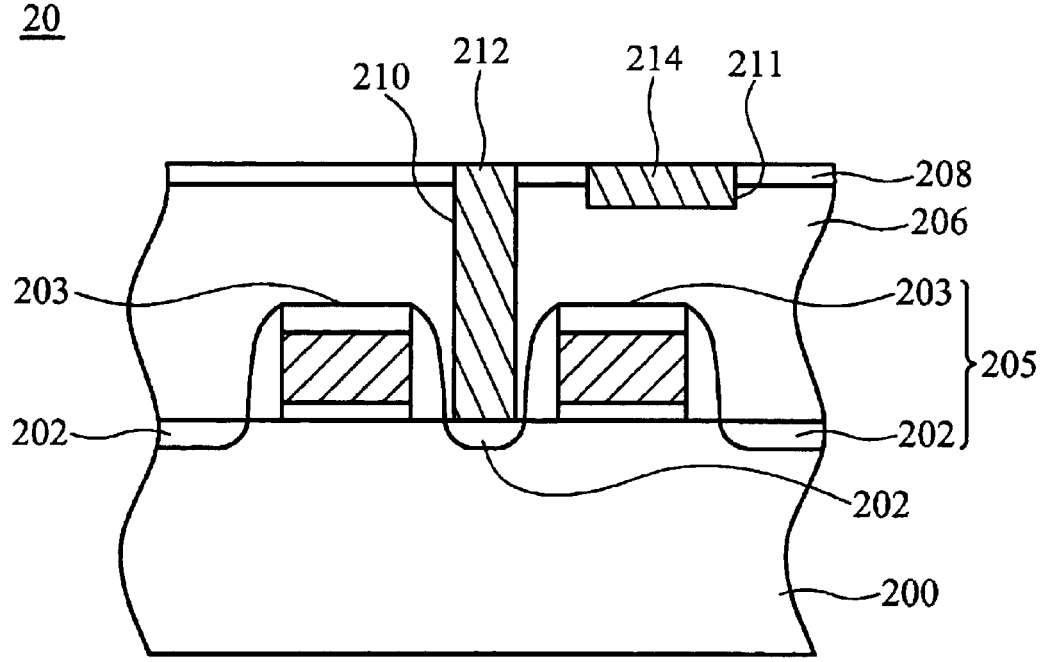

Finally, in FIG. 2d, after the photoresist layer 209 is removed, a photoresist pattern layer (not shown) is formed on the ILD layer 206, 208 for defining a trench opening therein. Next, a trench 211 is formed in the ILD layer 206, 208 near to the substrate contact 210 by etching. As mentioned above, the trench 211 is very close to the substrate contact ($C_s$) 210 due to high integration of the integrated circuits. However, since the substrate contact 210 of the invention is formed without etching defects or poor etching profiles, the substrate contact 210 does not contact the trench 211. That is, when the substrate contact 210 is filled with a conductive plug 212, such as a metal plug, and the trench 211 is filled with a metal layer 214, bridging between the conductive plug 212 and the metal layer 214 does not occur, and thereby prevents memory device failure. Accordingly, device yield can be increased.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming an interlayer dielectric layer, comprising the steps of:
   providing a substrate;
   forming a dielectric layer containing boron and phosphorous overlying the substrate;
   performing a plasma treatment on the dielectric layer containing boron and phosphorous;
   In-situ formation of a capping layer overlying the dielectric layer containing boron and phosphorous to serve as the interlayer dielectric layer with the dielectric layer containing boron and phosphorous; and
   performing a reflow process on the interlayer dielectric layer.

2. The method as claimed in claim 1, wherein the dielectric layer containing boron and phosphorous is a borophosphosilicate glass (BPSG) layer.

3. The method as claimed in claim 2, wherein the dielectric layer containing boron and phosphorous has a thickness of about 4000 to 10000 Å.

4. The method as claimed in claim 1, wherein the plasma treatment is performed using an inert gas as a process gas.

5. The method as claimed in claim 4, wherein the inert gas comprises argon or nitrogen.

6. The method as claimed in claim 1, wherein the plasma treatment is performed at 600 to 700° C.

7. The method as claimed in claim 1, wherein the plasma treatment is performed for 5 to 20 sec.

8. The method as claimed in claim 1, wherein the capping layer is an undoped silicate glass (USG) layer.

9. The method as claimed in claim 8, wherein the capping layer has a thickness of about 120 to 140 Å.

10. A method for preventing formation of etching defects in a contact, comprising the steps of:
    providing a substrate;
    forming a borophosphosilicate glass layer overlying the substrate;
    performing a plasma treatment on the borophosphosilicate glass layer;
    forming an in-situ undoped silicate glass layer overlying the borophosphosilicate glass layer to serve as an interlayer dielectric layer with the borophosphosilicate glass layer;
    performing a reflow process on the interlayer dielectric layer; and
    etching the interlayer dielectric layer to form at least one contact opening therein to expose the surface of the substrate.

11. The method as claimed in claim 10, further filling the contact opening with a conductive plug.

12. The method as claimed in claim 10, wherein the borophosphosilicate glass layer has a thickness of about 4000 to 10000 Å.

13. The method as claimed in claim 10, wherein the plasma treatment is performed using argon as a process gas.

14. The method as claimed in claim 10, wherein the plasma treatment is performed using nitrogen as a process gas.

15. The method as claimed in claim 10, wherein the plasma treatment is performed at 600 to 700° C.

16. The method as claimed in claim 10, wherein the plasma treatment is performed for 5 to 20 sec.

17. The method as claimed in claim 10, wherein the undoped silicate layer has a thickness of about 120 to 140 Å.

* * * * *